(12) United States Patent
Draper et al.

(10) Patent No.: US 7,499,648 B2
(45) Date of Patent: Mar. 3, 2009

(54) MULTISTAGE AMPLIFIER FOR RAPID ACQUISITION AND RANDOM RECEIVED SIGNAL POWER APPLICATIONS

(75) Inventors: Daniel S. Draper, Portland, OR (US); Charles E. Chang, Coto DeCaza, CA (US); Wim F. Cops, Newport Beach, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 559 days.

(21) Appl. No.: 10/952,488

(22) Filed: Sep. 27, 2004

(65) Prior Publication Data

US 2006/0067712 A1    Mar. 30, 2006

(51) Int. Cl.
    *H04B 10/16* (2006.01)
(52) U.S. Cl. .................................. 398/37; 398/177
(58) Field of Classification Search ................ 398/208, 398/210, 37, 38, 177; 455/572–574
    See application file for complete search history.

(56) References Cited

U.S. PATENT DOCUMENTS

| | | | | |
|---|---|---|---|---|
| 5,491,548 | A * | 2/1996 | Bell et al. .................. 356/73.1 |
| 5,710,660 | A * | 1/1998 | Yamamoto et al. ...... 359/341.44 |
| 6,081,362 | A * | 6/2000 | Hatakeyama et al. ....... 398/210 |
| 6,397,090 | B1 * | 5/2002 | Cho ............................ 455/574 |
| 6,657,488 | B1 * | 12/2003 | King et al. ..................... 330/9 |
| 7,127,391 | B2 * | 10/2006 | Chang et al. ................. 704/230 |
| 2003/0067662 | A1 * | 4/2003 | Brewer et al. ............... 359/189 |
| 2003/0122057 | A1 * | 7/2003 | Han et al. ................. 250/214 A |
| 2004/0095976 | A1 * | 5/2004 | Bowler et al. ............. 372/38.02 |
| 2004/0240041 | A1 * | 12/2004 | Tian et al. .................... 359/337 |
| 2005/0062530 | A1 * | 3/2005 | Bardsley et al. ............. 330/136 |

OTHER PUBLICATIONS

Abhijit Phanse, Naional Semiconductor, "Exercise 2: Define the time variance of a fiber optic channel's Impulse Response, and suggest a method for measuring it", IEEE 802.3ae, 11/00, 13 pages.
"PLL Design", http://members.innet.net.au/~richardh/PPH.htm, 9 pages.
Garth Nash, "AN535 Application Notes—Phase-Locked Loop Design Fundamentals", Motorola, Inc., 1994, 3 pages.
Ron Bertrand, "The Basics of PLL Frequency Sythesis", Online Radio & Electronics Course, Apr. 2002, 9 pages.

* cited by examiner

*Primary Examiner*—Leslie Pascal
(74) *Attorney, Agent, or Firm*—Weide & Miller, Ltd.

(57) ABSTRACT

A method and apparatus for signal amplification and decision device operation on a signal which has a magnitude, peak value, or other average power that varies over time. In general, a peak detector detects the peak value of a received signal and responsive to the peak value, selectively enables a decision device when the signal is amplified to increase decision device accuracy. The decision may occur before the amplification forces the signal into saturation. Multi-stage amplification in combination with controlled switching or multiplexing may be utilized to selectively amplify the signal and selectively initiate decision device operation. The peak detector value may also control signal amplification levels in a multi-stage amplifier. Responsive to the peak value, a switch, which receives as its input the output from one or more amplifier stages, may be controlled to output the signal after a desired amount of amplification.

22 Claims, 9 Drawing Sheets

MULTISTAGE AMPLIFIER FOR RAPID ACQUISITION AND RANDOM RECEIVED SIGNAL POWER APPLICATIONS

FIELD OF THE INVENTION

The invention relates to communication systems and in particular, to a method and apparatus for rapid acquisition of a received signal at an unknown power level.

RELATED ART

As is commonly understood, modern communication systems transmit data between remote locations to achieve information transfer. This process occurs in electronic devices other than communication systems to rapidly exchange or transfer data between systems. One such exemplary environment is within an optical communication system.

FIG. 1 illustrates an exemplary prior art optical communication system. As shown, an optical transceiver 104 communicates with another transceiver. However, each transceiver 104 communicates with one other transceiver, and thus, the distance between the transceivers is a single distance D. In addition, prior art communication systems are configured as always for constant transmit environments. Thus, bits of data are continually being transmitted from one transceiver to another. As a result, the power level of the signal is known and over time, the receiver associated with a transceiver may be trained to perform with a low bit rate (BER) for a given received signal power level.

As a result, prior art optical receiver structure shown in FIG. 2 may be utilized. As shown, an optical detector 204, such as a photo diode, receives an optic signal from an optic fiber 200. The optical detector 204 converts the light energy to an electrical current representative of the optic signal.

The optical detector 204 connects to a trans-impedance amplifier (TIA) 208 which converts the current to a voltage and may optionally perform amplification of the signal. The output of the TIA 208 feeds into a limiting amplifier 212 which may perform precision amplification on the signal before providing the signal to a clock data recovery circuit (CDR) 216 or other downstream processing. The limiting amplifier 212 may also perform a decision operation.

While this circuitry is adequate for prior art application, such as the example environment shown in FIG. 1, it is unable to meet the specification when data acquisition must occur with a limited time period or a limited number of bits. In particular, certain signals received by the optical detector may not arrive at a consistent magnitude over time, or may arrive in bursts, or both. As a result, the prior art method for TIA construction and limiting amplifier construction is unable to rapidly adapt to changing signal magnitudes or burst mode signals. Such prior art designs utilize servo loops, or feedback loops, which have a time constant that settles at an undesirably slow rate. Consequently, prior art designs are unable to operate in environments that require rapid acquisition, which is to say rapid reduction in BER, of a signal that varies in magnitude and continuity.

The method and apparatus described below overcomes these drawbacks and provides additional advantages.

SUMMARY

To overcome the drawbacks of the prior art and provide additional advantages and benefits, the method and apparatus is disclosed herein for rapid and accurate decision device operation on a received signal that varies in power or peak value over time. While the principles disclosed herein apply to numerous different operational environments, one example environment that requires rapid and accurate acquisition of a signal that varies in peak value over time is in a passive optical network (PON). In such an environment, the remote stations, which communicate with a multi-point location, such as a central office, are located at various different distances and, as such, the signals arrive at the transmitter at different power levels. As a result, the shared receiver must rapidly adapt to signals that arrive at different power levels, such as different peak values, average power, or any other power indicator or power level information. In particular, the amount of amplification may be tailored in response to the power level of the received signal and decision device operation, such as timing, may be tailored in response to the power level of the received signal.

In one embodiment, a method for performing a decision operation on a received signal may be performed by receiving a first signal where, the first signal is received at a first power level and then detecting the peak value of the first signal. This method then amplifies the received signal and, responsive to the peak value, activates one of two or more decision devices to thereby perform a decision operation on the received signal.

In one embodiment, the decision operation occurs before the signal is amplified into saturation, which would otherwise result in a higher bit error rate (BER). In one embodiment, the decision device comprises an amplifier with gain control. For example, amplifying the signal occurs in stages, and the number of stages through which the signal is amplified is based on the peak value of the received signal. This may occur by analyzing the peak value with a controller to generate a control signal and sending the control signal to a switch that thereby selects which decision device to activate.

Because the signal may change in power level, such as peak value over time, the method further comprises receiving a second signal and detecting the peak value of the second signal. It is contemplated that the peak value of the second signal is different than the peak value of the first signal. The method would then amplify the received second signal in response to the peak value of the second signal, activate a different decision device to thereby perform a decision operation on the second received signal.

In an environment having a multi-stage amplifier, the method may comprise receiving a signal and providing the signal to a multi-stage amplifier having two or more amplifiers such that wherein at least one of the two or more amplifiers has an output. The method detects magnitude information regarding the signal and processes the magnitude information to generate a control signal. The control signal may be used to control a switching apparatus to selectively output as the amplified signal a signal on an output of one of the two or more amplifiers. As can be appreciated, the amount of amplification is dependant on the magnitude information.

In one variation, the magnitude information comprises information for the peak value of the signal. The step of processing the magnitude information may be performed by a processor, control logic, or both. This method may also perform the steps of receiving a second signal and detecting magnitude information for the second signal. This magnitude information for the second signal is used to generate a second control signal and then the method controls the switching apparatus with the second control signal to selectively output the signal to an amplified version of the signal on an output of one of the two or more amplifiers.

Numerous different systems may be utilized to implement these or other similar methods. In one embodiment, a system for determining at which stage in a multi-stage amplifier system to perform a decision operation on a received signal that varies in peak value over time is disclosed. This system may comprise a peak detector configured to detect the peak value of the signal and a controller configured to selectively activate a decision device based on the peak value of the signal. The system may also comprise two or more decision devices configured to perform a decision operation on the signal responsive to a control signal from the controller such that the controller selects which decision device will perform the decision operation on the signal based on the peak value of the signal. In this manner, a decision operation may occur when the signal has undergone a desired level of amplification. The desired level of amplification may comprise an output swing sufficiently large to select an accurate slice level that results in good signal to noise ratio and low BER.

In one embodiment, the controller comprises or includes a switch configured to output the control signal to the appropriate decision device and the decision devices may be configured as amplifiers. It is also contemplated that a peak detector may be configured to determine average power and decision device operation is based on average power. As discussed above, the system may be configured as part of a receiver in a passive optical network to rapidly adapt to changes in received signal strength.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
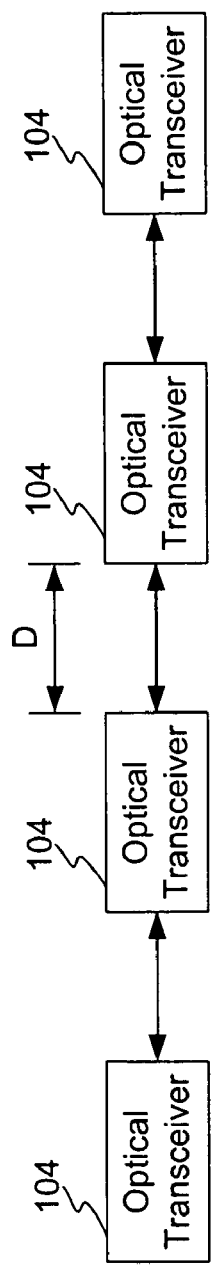
FIG. 1 illustrates a block diagram of a prior art optical communication system.
Figure 2:
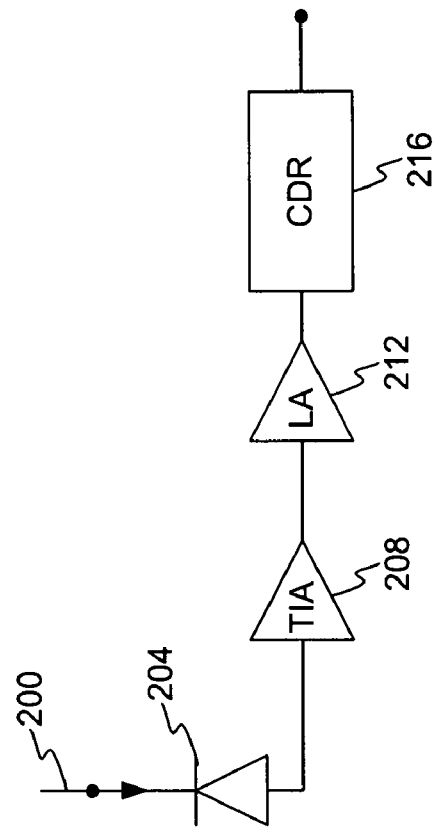
FIG. 2 illustrates a block diagram of an example embodiment of a prior art receiver for use in an optical communication system.
Figure 3:
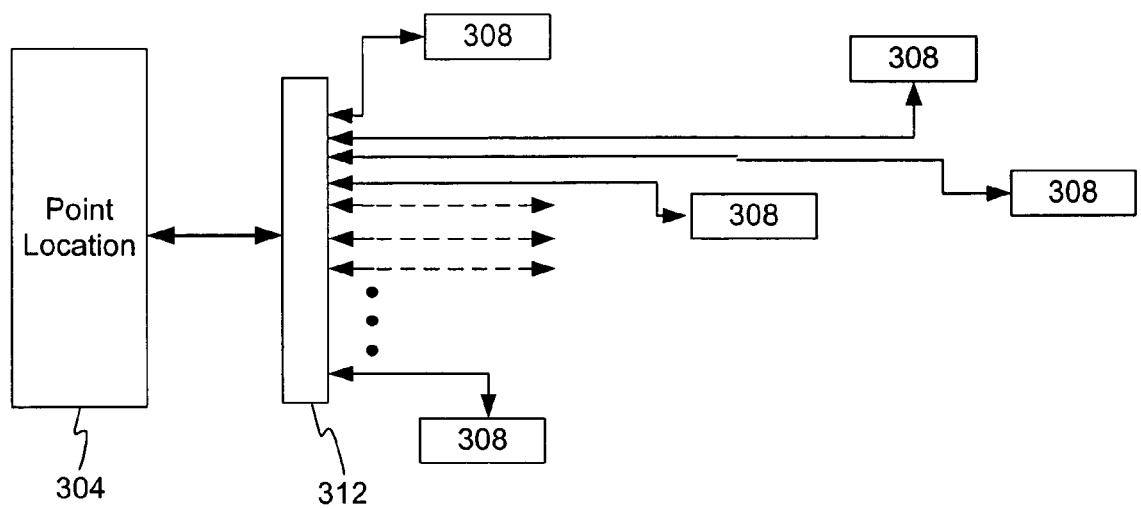
FIG. 3 illustrates a block diagram of an example environment of a passive optical network.

In contrast to prior art designs for limiting amplifiers and TIA devices, the limiting amplifiers and TIA devices disclosed herein are capable of rapid signal acquisition to achieve low bit rate processing in a short time period. As a result, such embodiments are useful in a variety of prior art environments and new applications. One such example environment is shown in FIG. 3. As shown in FIG. 3, a passive optical network is one such example environment. As compared to FIG. 1, the network configuration shown in FIG. 3 utilizes multi-point location 304 that communicates with multiple remote locations 308 over two or more optic communication channels that may optionally be combined into a single fiber at a splitter 312, multiplexer, or other device configured to operate as shown. In this example environment, the multi-point location 304 utilizes a receiver that multiplexes its resources with the two or more remote locations, which are located at various different distances from the point location.

Figure 4:
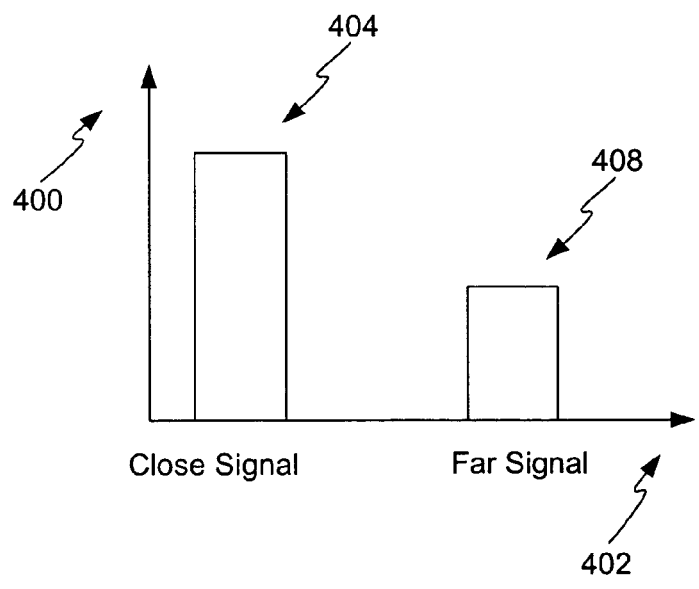
FIG. 4 illustrates a block plot of exemplary signal magnitudes which vary over time due to varying transmit distances.

In one embodiment, the receiver of the multi-point location 304 utilizes time multiplexing such that each remote location 308 is assigned a time slot during which it may transmit to the point location. Consequently, signals received by the multi-point location receiver are arriving at different magnitudes due to attenuation of the signal, which in turn is dependant on the distance of the remote location 308 from the multi-point location 304. FIG. 4 illustrates exemplary plots of exemplary signals received at the multi-point location 304 of the communication system shown in FIG. 3. A horizontal axis 402 represents time while a vertical axis 400 represents signal magnitude. A first signal 404 represents a signal received from a remote location transmitter located close to the multi-point location. As such, the magnitude of this signal is large, as compared to a signal received from a more distant remote location transmitter.

In contrast, signal plot 408 represents a signal received from a distant remote location transmitter. As compared to plot 404, the signal represented by plot 408 is of lower magnitude when received at the multi-point location due to attenuation from the long transmission distance.

The varying magnitude of the signals received at different times, such as during the different time slots of time multiplexed operation, causes challenges for the receiver architecture of the point location because it may be necessary or desired to rapidly process the received signal at a low error rate. By way of example, specification for one exemplary passive optical network (PON) requires a bit error ratio (BER) of $10^{-10}$ within 10 bits. At the data transmit rate of the specified 2.5 Gbit/sec this equates to only 4 nanoseconds to settle to the desired BER. As described above in the background, the time constant and other characteristics of the prior art loops make achieving this specification impossible or require expensive and commercially unfeasible designs.

Figure 5A:
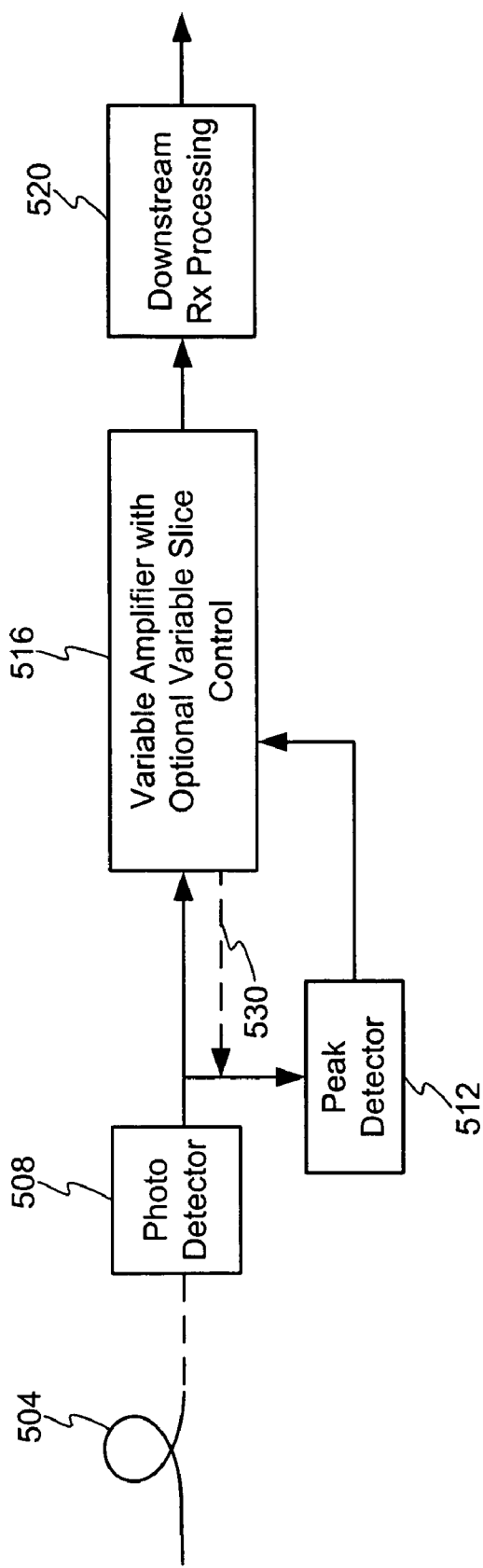
FIGS. 5A and 5B illustrate a block diagram of an example embodiment of a signal amplifier with an optional decision device configured for rapid acquisition.

FIG. 5A illustrates a block diagram of an example embodiment of a signal amplifier with an optional decision device configured for rapid acquisition. This is but one example embodiment and, as such, it is contemplated that other embodiments may be arrived at without departing from the scope of the claims that follow. In this example embodiment, an optic channel 504 carries one or more signals, which are provided to a photo detector 508. Although shown in an optical environment, the principle disclosed herein may be utilized in any environment and, as such, the channel may comprise any type channel including, but not limited to, metallic conductor, such as twisted pair, coaxial cable, and circuit board traces; or a free space channel such as for wireless communication.

The photo detector 508 converts the received optic signal to a corresponding electrical signal, which in turn is provided to a peak detector 512 and a variable amplifier with optional variable slice control 516 (hereinafter variable amplifier module). The term peak detector is defined to mean any device that is capable of determining or measuring the peak value, common mode value, average value, or any other indicator or information regarding a signal power level or peak magnitude. The peak detector 512 may optionally comprise control logic, processor interface, processor capability, or other control capability. In one embodiment, the peak detector 512 is configured to detect the peak of the received signal. This peak value may be provided directly to the variable amplifier module 516 or processed, such as by the control aspects of the peak detector to provide one or more signals that are tailored to control or activate the variable amplifier module 516 as desired and described herein. The output of the variable amplifier module 516 may be provided an apparatus to perform downstream receiver processing 520 as would be understood by one of ordinary skill in the art.

In another embodiment the input to the peak detector 512 is provided from the variable amplifier 516 via input 530 shown as a dashed line in FIG. 5A. It is contemplated that the variable amplifier 516 may comprise one or more transimpedance amplifiers (TIA) which may have a low impedance and this impedance may change if the TIA employs automatic gain control. As a result, it may be desirable to detect the peak of the signal after one or more stages of the variable amplifier instead of before the variable amplifier. It is further contemplated that any of the embodiments shown or discussed herein may be configured with the input to the peak detectors arriving from the input to the amplifier stage or arriving after one or more stages of amplification. As such, the illustrations, discussions or claiming of a peak detector input should be interpreted as meaning the input to the peak detector may comprise the input to the amplifier stages or after one or more stages of amplification.

The variable amplifier module 516 comprises one or more amplifier stages, one or more decision devices, or both. The variable amplifier module 516 performs a desired level of amplification on the received signal based on the input from the peak detector 512. The level of amplification may be dependant on the peak value of the received signal. The decision device operation, such as a slicer operation, may be dependant on the peak value of the received signal.

In one embodiment, the variable amplifier module 516 comprises two or more amplifier stages, which are controlled by a signal from the peak detector. Responsive to the peak detector, the amplifiers 516 apply a desired amount of gain to the received signal. As a result, slice decisions may occur upon a signal after the signal has undergone a desired amount of amplification. In addition, the peak detector may rapidly detect the peak, thereby allowing for rapid determination of the peak level and the amount of amplification to meet the needs of the particular application.

While the particular needs of a receiver system may vary between applications, in one embodiment, it is desired to perform a slice operation at the point of maximum amplification of the signal but before the signal is amplified into saturation. This allows for a widening of the eye, when the received signal is represented in terms of an eye diagram, and as such, more accurate slice decision may be made. This results in a reduced BER. By rapidly detecting the peak value of the signal, applying the desired level of amplification, and knowing when to perform a slice operation with a decision device, a received signal may be accurately and quickly sliced to yield a digital or otherwise quantized signal. This is true even when the magnitude of the received signal is unknown, such as in a passive optical network environment or any other application where the power level of a received signal is unknown and it is desired to rapidly and accurately acquire the received signal.

Figure 5B:
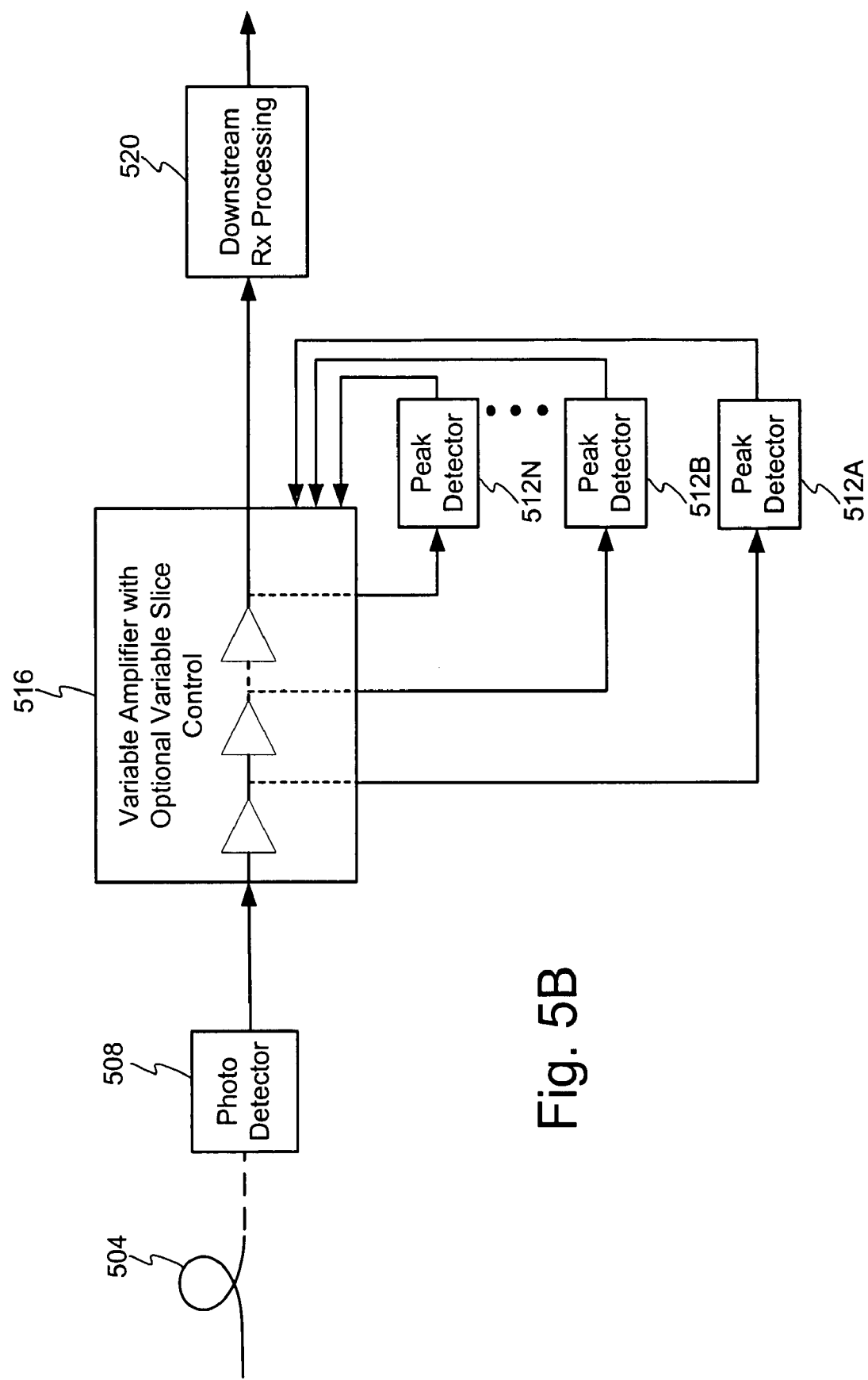

FIG. 5B illustrates a block diagram of an example embodiment of a signal amplifier configured for rapid acquisition with multiple peak detectors. As compared to FIG. 5A, identical elements are labeled with identical reference numerals. In contrast to the embodiment of FIG. 5A, this embodiment utilizes two or more peak detectors 512A-512N, where N may comprise any whole number. Use of two or more peak detectors 512A-512N may be well suited to process received signals that have a wide dynamic range. For such a signal, a single peak detector may lack the dynamic range necessary to correctly select the appropriate amplification slice point. It is further contemplated that any of the embodiments shown or discussed herein may be configured with multiple peak detectors and as such, the illustration, discussion or claiming of a peak detector should be interpreted as meaning one or more peak detectors.

Figure 6:
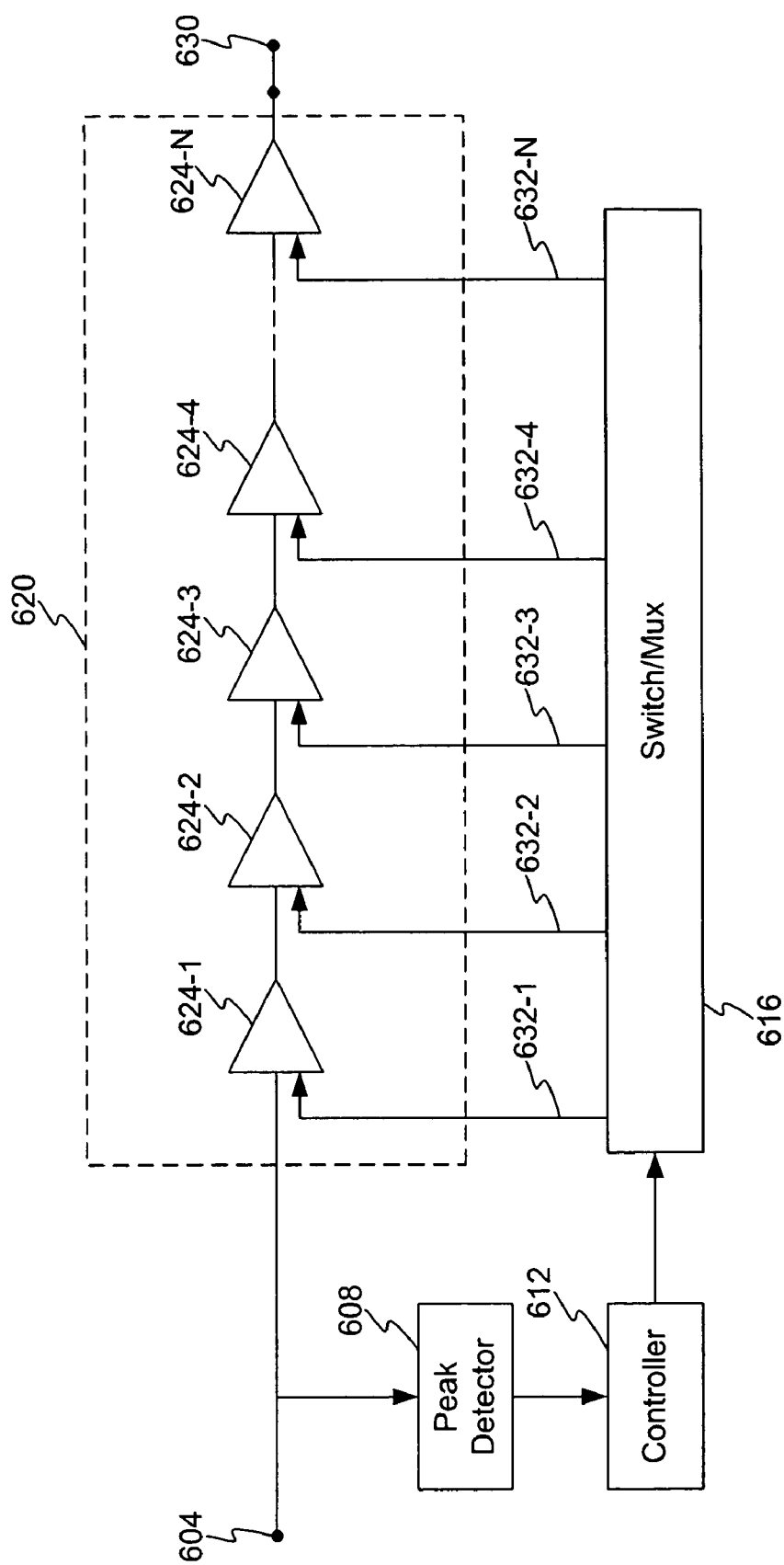
FIG. 6 illustrates an example embodiment of a multi-stage amplifier configured with a peak detection based control system.

FIG. 6 illustrates an example embodiment of a multi-stage amplifier configured with a peak detection control system. This is but one possible example embodiment and as such, other embodiments may be configured that do not depart from the claims that follow. As shown, an input 604 receives one or more signals over time. The one or more signals may arrive at different power levels or magnitudes. The input 604 connects to a peak detector 608 and a multi-stage amplifier 620, which is discussed below in more detail.

The peak detector 608 connects to controller 612, which in turn connects to a switch or multiplexer device 616. The switch 616 has one or more control lines that connect to the amplifier 620. The peak detector 608 is configured to rapidly detect the peak of a received signal. Peak detection may occur using any method or system as would be understood by one of ordinary skill in the art. As an advantage over prior systems, the peak detector 608 detects the peak value quickly and thus, operation speed is not limited by loop bandwidth, time constants, feedback delays or other prior art limitations. In addition, peak detection is readily implemented on an integrated circuit and does not consume undesirably large percentages of space, power, or processing resources.

The controller 612 may comprise any type apparatus configured to output a control signal to the switching structure 616 responsive to the peak detector output. In one embodiment, the controller 612 compares the input from the peak value to one or more thresholds and is dependant on the peak value, outputs a control signal to the switch 616. In one embodiment, the control logic may comprise analog or digital logic, a processor, one or more comparators, and appropriate reference levels, which may be stored in memory or provide in some other manner.

Turning now to the amplifier 620, in one embodiment, the amplifier 620 comprises two or more amplifier stages 624-1, 624-2, 624-3, ... 624-N, wherein N equals any whole number. As shown, each stage 624 cascades into the subsequent stage, and as a received signal passes from one stage to the next, the signal is amplified. One or more aspects of one or more stages may be controlled by the control signals from the switch 616. In one embodiment, one or more of the amplifier stages 624 are equipped with or capable of performing a slice operation on the received signal. The control signals may thus be configured to activate a slice operation on the received signal, based upon the output of the amplification stage 624, that will provide optimum amplification while still avoiding signal saturation.

During one exemplary method of operation, the system of FIG. 6 is configured to slice the signal after the signal is amplified, but before saturation. Upon receiving a signal, the signal is provided to the amplifier 620 and a peak detector 608. The peak detector 608 processes the received signal to calculate the peak magnitude or other power or magnitude indicator for the received signal. The peak value or other signal related to the peak value is provided to the controller 612 or directly to the switch 616. If so configured, the controller 612 may process the peak value, such as to compare the peak value to one or more threshold values. In so doing, the controller 612 may generate an output to the switch 616 that, based on the magnitude of the received signal, will control the switch to selectively provide one or more control signals to the amplifier 620 to thereby control which stage 624 will perform a slice operation on the signal.

By way of example, if a received signal has a large magnitude, then the signal, when progressing through the stages 624 of the amplifier, may saturate at one of the early stages. To insure that the slice operation occurs before saturation of the signal, the peak detector detects the peak or other magnitude indicator and in connection with the controller 612 and switch 616 provides a control signal to the amplifier via control lines from the switch to perform the slice operation at the input of the second stage, in this embodiment stage 624-2. It is contemplated that the magnitude of the received signal would saturate at the output of the second stage and this would compress the size of the eye. Thus, the second stage 624-2 performs the slice operation.

In contrast, upon reception and peak detection of a signal having a low or small magnitude, the controller and switch 616 force a later amplifier stage to serve as the decision device to perform a slice operation. As a result, the signal undergoes more amplification before the slice operation occurs. Thus, responsive to such a signal, stage 624-4 may be controlled to perform the slice operation. In this manner, the slice operation will occur on a fully amplified signal that has not been amplified to the point of saturation.

Figure 7:
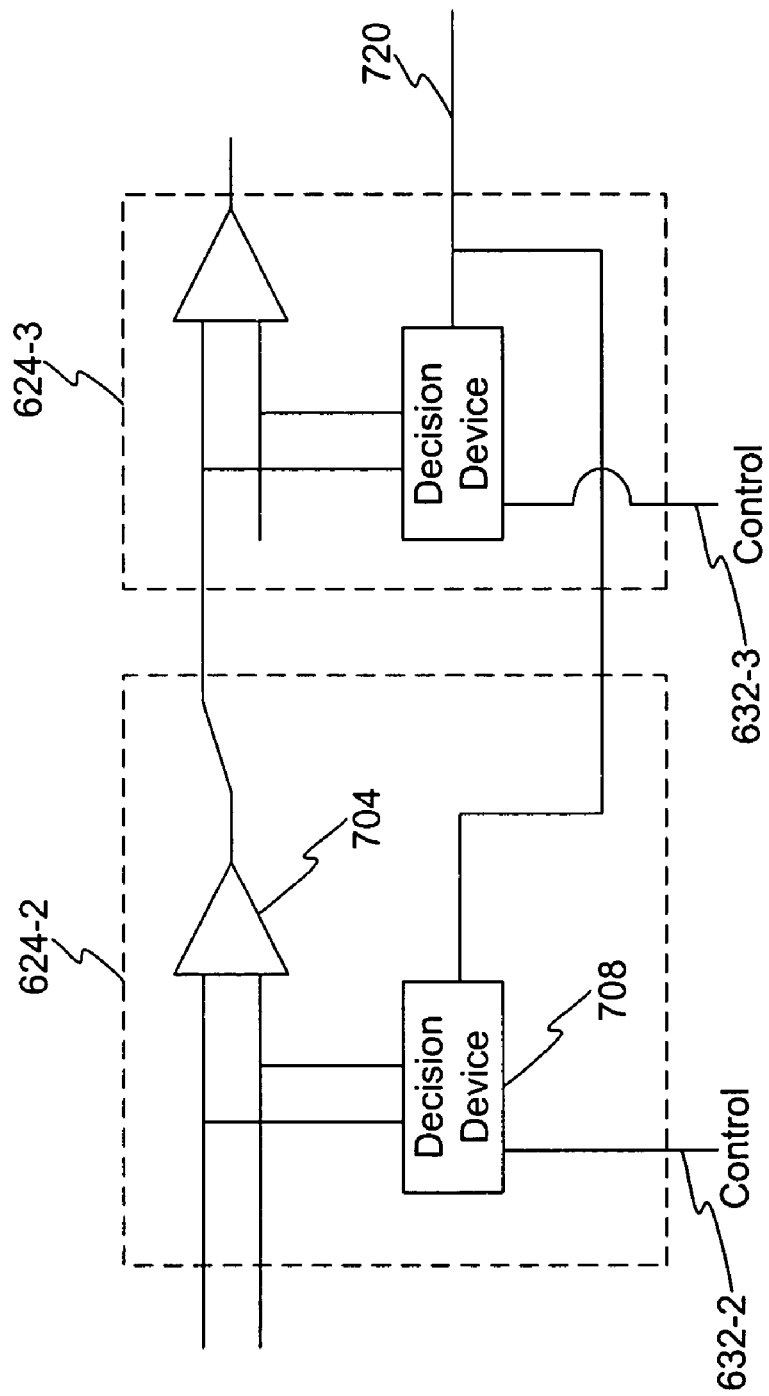
FIG. 7 illustrates an example embodiment of a pair of amplifier stages as shown in FIG. 6.

FIG. 7 illustrates an example embodiment of a pair of amplifier stages, shown as elements 624 in FIG. 6. This is but one example embodiment and, as such, it is contemplated that one of ordinary skill in the art may generate other embodiments for amplification and slice operation. In this example embodiment, each stage is configured generally similarly and, as such, only stage 624-2 is described in detail. As shown, an amplifier 704 receives an incoming signal from the preceding stage or from a photo detector (not shown in this embodiment). The input ports of the amplifier 704 also connect to a decision device 708 thereby providing access to the signal for the decision device. The decision device 708 also receives a control signal on control line 632, in this embodiment from the switch shown in FIG. 6. Responsive to the control signal on the control line 632-2, the decision device 708 performs a slice operation on the received signal. The output of the decision device is output on a common decision device output line 720.

Absent a control signal on control line 632-2, the amplifier 704 amplifies the signal and outputs the amplified signal to the subsequent stage 624-3, which performs in a similar manner to that shown and described for stage 624-2. In this fashion, the magnitude of a received signal is detected, and responsive to this peak value, amplified through one or more stages to create a signal of desired amplitude which has not yet entered saturation or the level of saturation does not interfere with decision device operation.

Figure 8:
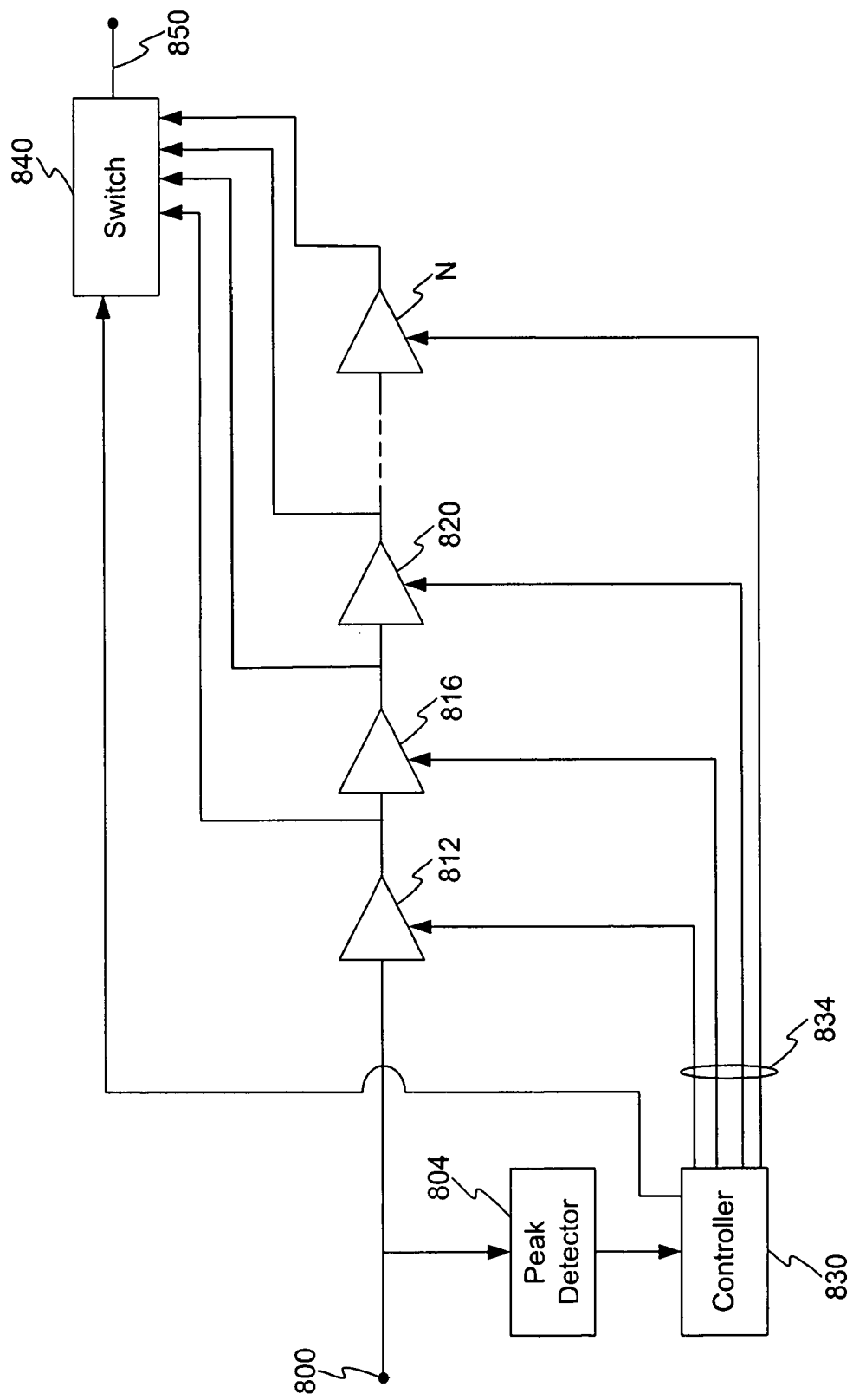
FIG. 8 illustrates a block diagram of a peak detector controlled amplifier.

FIG. 8 illustrates a block diagram of a peak detector controlled amplifier. In this embodiment, the decision device is omitted. In one example environment, this embodiment may serve as a TIA type amplifier. As shown, an input 800 connects to a peak detector 804 and a first amplifier 812. The first amplifier output 812 feeds into a second amplifier 816, which in turn has an output that feeds into a third amplifier 820. The amplifiers are cascaded up to an Nth amplifier N. The output of each amplifier may be connected to a switch 840 while the peak detector 804 feeds into a controller 830. The controller 830 has an output connected to at least one of the amplifiers 812, 816, 820, N, and a control output to the switch 840. The switch is configured with an output 850. The switch 840 has one or more inputs connected to the output of the amplifiers 812, 816, 820 . . . N as shown. Via these connections, the output from one or more amplifier stages 812, 816, 820 . . . N may be provided to the switch 840.

One exemplary method of operation may be generally described as detecting the magnitude of a received signal, where the magnitude of the incoming signal may be unknown or varying over time, and amplifying the signal. It may be desired to avoid saturation or non-linear output. In particular, in one example method of operation, a signal received at input 800 is provided with the first amplifier 812 and the peak detector 804. The peak detector 804 rapidly calculates the peak value of the signal, or some other indicator of signal magnitude, and provides this information to the controller 830.

In response to this information, the controller processes this information to generate one or more control signals that are provided to the one or more amplifiers 812, 816, 820 . . . N, to the switch 840, or both. The one or more control signals provided to the one or more amplifiers 812, 816, 820 . . . N may be configured to control amplifier amplification level, bias level, operation, gain, offset or any other factor.

Based on the magnitude or common mode value of the received signal as detected by the peak detector, a control signal from the controller 830 maybe provided to the switch 840. This control signal may control which input to the switch 840 is provided as the switch output. In this manner, the control signal from the controller 830 to the switch 840 may determine which amplifier stage output is output from the switch and, as a result, based on the peak value or other signal characteristic, a variable amount of gain may be applied to the received signal.

This embodiment has numerous advantages over amplification systems of the prior art. One such advantage is that the system of FIG. 8 does not suffer from undesirably long lag or settling time caused by loop time constants or other factors. The peak detector and switch control operation may be made to occur very rapidly, such as for example within 10 bits or less, while prior art designs may take 100 or even 1000 bits to settle to a BER that meets specification.

Another advantage is that the solution proposed herein provides a low cost, accurate, and space and power efficient solution to address variable amplification to process signals that vary in magnitude over time. As compared to prior art solutions capable of performing at equivalent performance specification, the solution disclosed herein is less complex and, as a result, less expensive. For example, using the various implementation disclosed herein eliminates the need for the adjustable gain control (AGC) systems of the prior art. Thus, the method and apparatus disclosed and claimed herein increases the functionality by reducing settling time to a desired BER, yet eliminates components as compared to the prior art system.

Figure 9:
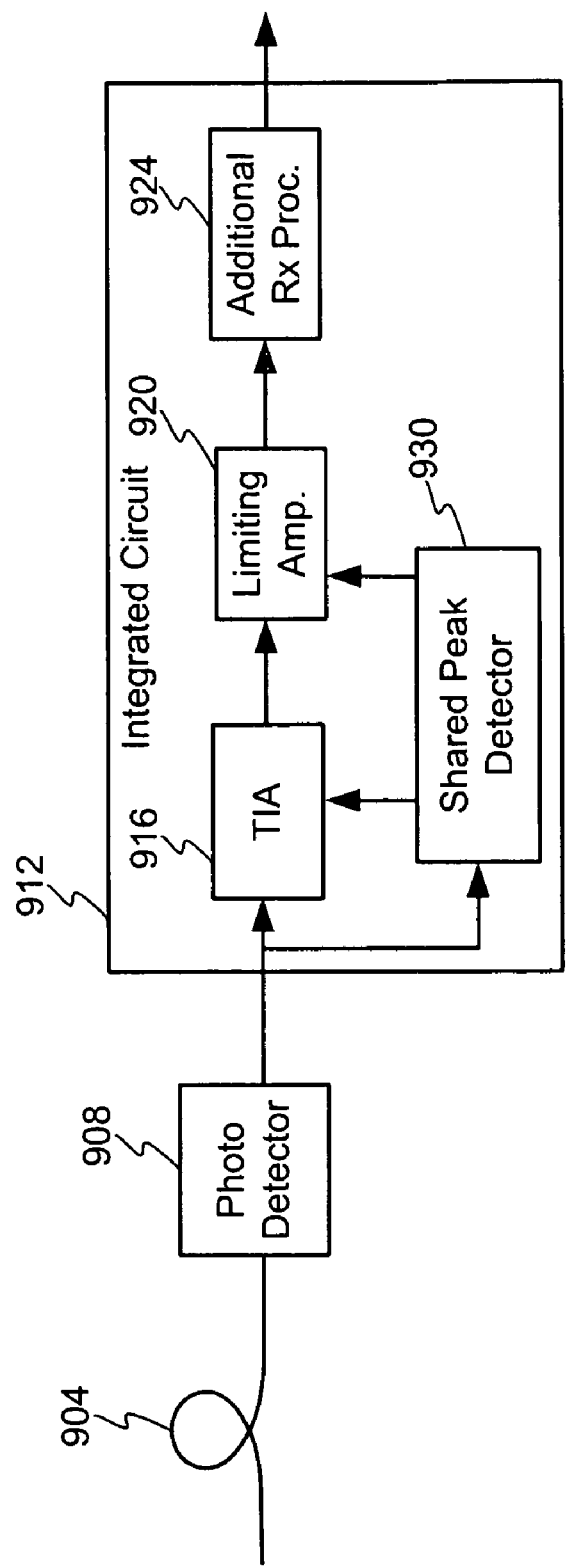
FIG. 9 illustrates a block diagram of an example embodiment of an amplifier system as disclosed herein assembled within a single integrated circuit.

FIG. 9 illustrates a block diagram of an example embodiment of an amplifier system as disclosed herein assembled within a single integrated circuit. It is contemplated that TIA and the limiting amplifier may be configured as separate elements and each may utilize a dedicated peak detector. It is further contemplated that the TIA and the limiting amplifier may be combined into a single integrated circuit 912, as shown in FIG. 9. In such an embodiment, a channel, such as an optic fiber 904, connects to a photo detector 908, which in turn connects to an integrated circuit 912.

In this embodiment the integrated circuit comprises a TIA 916, the output of which feeds into a limiting amplifier 920. Both the TIA 916 and the limiting amplifier 920 may be configured to share a common peak detector 930 as shown. The output of the limiting amplifier 920 may be subject to additional processing in element 924 or output from the integrated circuit 912. A slice operation may occur within the integrated circuit 912. Operation may occur as described above.

Figure 10:
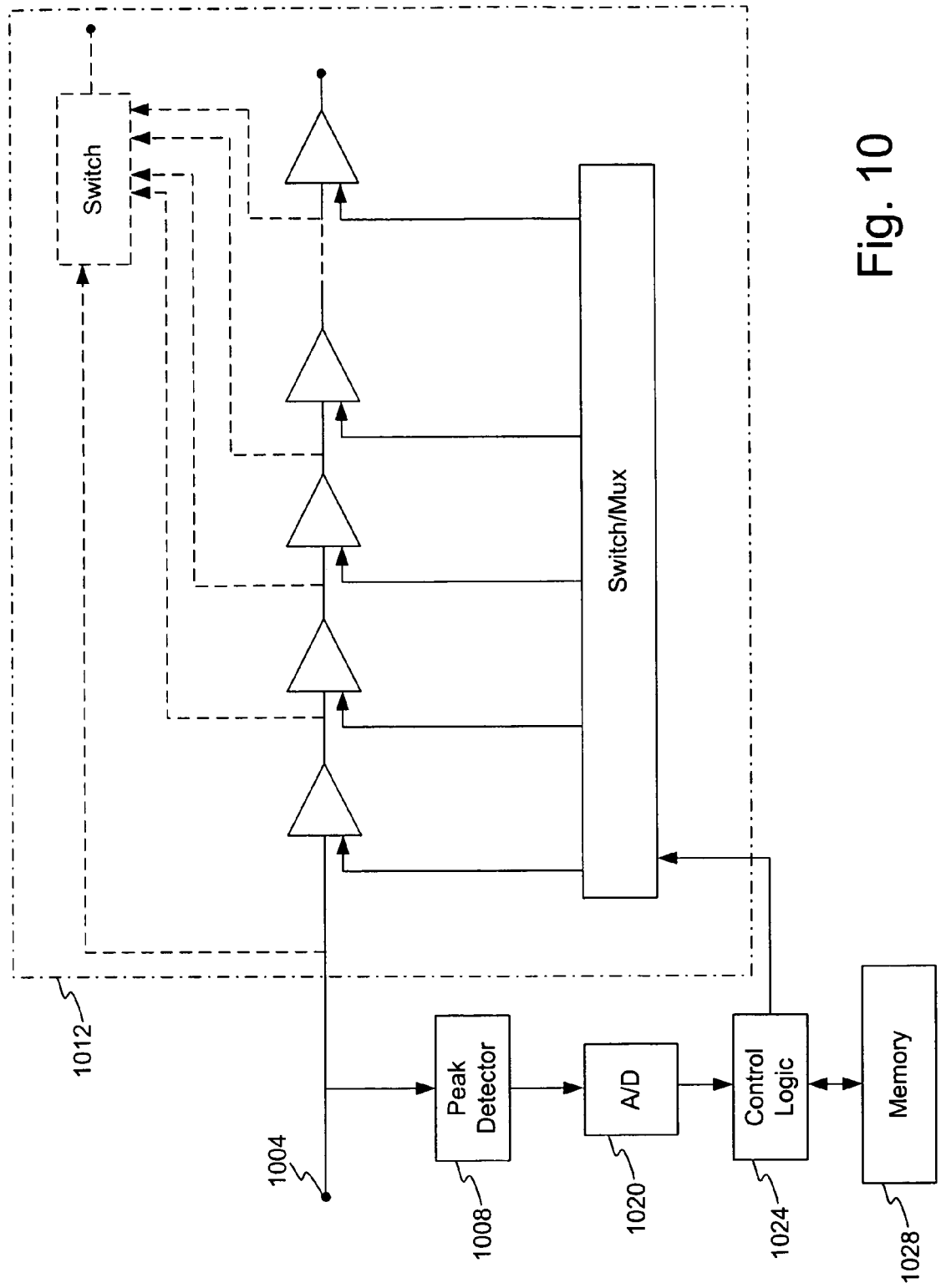
FIG. 10 illustrates a block diagram of an example embodiment of a digital implementation.

It is further contemplated that the method and apparatus disclosed herein may be implemented in either an analog or digital environment. FIG. 10 illustrates a block diagram of an example embodiment of a digital implementation. As compared to prior figures, only the aspects that differ are described in detail herein. It is contemplated that a digital implementation may be configured for operation as a limiting amplifier or a TIA.

As shown, an input 1004 connects to an amplifier module 1012 and a peak detector 1008. The output of the peak detector 1008 connects to an analog to digital (A/D) converter 1020 which is configured to convert the peak value to a digital value. Alternatively, the A/D conversion may be performed prior to the peak detection. The peak value or the digitized received signal, either of which may now be in a digital format, is provided to digital control logic 1024 that may be configured to perform a comparison to the digital value to one or more stored values or thresholds. The control may comprise a processor. Accordingly, a memory 1028 connects to the control logic 1024 and may be configured to store one or more control values or optimal slice point or amplification level data. The control logic 1024 may retrieve this information from memory and utilize this information to control the amplifier 1012. In this embodiment, the amplifier 1012 may comprise either a TIA type amplifier, as shown by the solid lined portion of the amplifier block 1012, or a limiting amplifier, as shown by the dashed line portion of the amplifier block 1012, or both.

In one embodiment, the control logic 1024 performs a look-up operation based on the detected peak value. In one embodiment, this may occur at high speed, such as with a content address memory (CAM) look-up table. In contrast to the analog embodiment which may still settle, albeit rapidly, to an optimum value, the digital implementation has the advantage of rapid, high rate acquisition of optimum settings. In particular, in one embodiment, upon detection of the power level of a received signal, the power level may be converted to a digital value and a memory look-up performed to determine the optimum settings for that particular power level. It is assumed that the optimum settings may be stored in memory. As with the other embodiments, because a feedback loop is not utilized, speed is not compromised.

While various embodiments of the invention have been described, it will be apparent to those of ordinary skill in the art that many more embodiments and implementations are possible that are within the scope of this invention.

What is claimed is:

1. A method for performing a decision operation on a received signal comprising:
   receiving a first signal, the first signal received at a first power level;
   detecting the peak value of the first signal;
   amplifying the received signal wherein the amount of amplification is based on the peak value; and
   responsive to the peak value, activating one of two or more decision devices to thereby perform a decision operation on the received signal, wherein which one of the two or more decision devices are activated is dependent on the peak value.

2. The method of claim 1, wherein the decision operation occurs before the signal is amplified into saturation.

3. The method of claim 1, wherein the decision device comprises an amplifier with gain control.

4. The method of claim 1, wherein the amount of amplifying the signal occurs in stages and the number of stages the signal is amplified is based on the peak value of the received signal.

5. The method of claim 1, further comprising analyzing the peak value with a controller to generate a control signal and sending the control signal to a switch to thereby control which decision device to activate.

6. The method of claim 1, further comprising:
   receiving a second signal;
   detecting the peak value of the second signal, wherein the peak value of the second signal is different than the peak value of the first signal;
   amplifying the received second signal;
   responsive to the peak value of the second signal, activating a different decision device to thereby perform a decision operation on the second received signal.

7. A method for amplifying a signal comprising:
   periodically receiving an optic signal;
   converting the optic signal to an electrical signal;
   providing the electrical signal to a multi-stage amplifier having two or more amplifiers to create an amplified signal, wherein at least one of the two or more amplifiers has an output;
   detecting magnitude information regarding the signal, wherein the periodic nature of the optic signal results in changes in magnitude of the optic signal;
   processing the magnitude information to generate a control signal; and
   controlling a switching apparatus with the control signal to selectively output as the amplified signal a signal on an output of one of the two or more amplifiers, wherein the amount of amplification is dependant on the magnitude information.

8. The method of claim 7, wherein the magnitude information comprises information regarding the peak value of the signal.

9. The method of claim 7, wherein the multi-stage amplifier comprises a TIA or limiting amplifier or both.

10. The method of claim 7, wherein processing the magnitude information is performed by a processor or control logic, or both.

11. The method of claim 7, further comprising receiving a second signal;
   detecting magnitude information regarding the second signal;
   processing the magnitude information for the second signal to generate a second control signal;
   controlling the switching apparatus with the second control signal to selectively output as the amplified signal an amplified version of the signal on an output of one of the two or more amplifiers.

12. The method of claim 11, wherein the switching apparatus comprises a multiplexer.

13. A system for determining at which stage in a multi-stage amplifier system to perform a decision operation on a received signal that varies in peak value over time, the system comprising:

an input configured to receive the signal;

one or more peak detectors configured to detect the peak value of the signal;

a controller configured to selectively activate a decision device based on the peak value of the signal; and two or more decision devices configured to perform a decision operation on the signal responsive to a control signal from the controller, wherein the controller selects which decision device will perform the decision operation on the signal based on the peak value of the signal.

14. The system of claim 13, wherein the controller further comprises a switch configured to output the control signal to the appropriate decision device.

15. The system of claim 13, wherein the two or more decision devices are configured as amplifiers.

16. The system of claim 13, further comprising two or more amplifier stages configured to amplify the signal prior to the decision operation to thereby increase accuracy of the decision operation and the control signal is generated to perform the decision operation before the signal is amplified into saturation.

17. The system of claim 13, wherein the one or more peak detectors are configured to determine average power and the timing of decision device operation is based on average power.

18. The system of claim 13, wherein the system is configured as part of a receiver in a passive optical network to rapidly adapt to changes in received signal strength.

19. A system for amplifying a received signal based on power level information of the received signal to adapt to changes in power level of the received signals, the system comprising:

a power level detector configured to monitor the received signal and generate signal strength information regarding the power level of a received signal;

three or more amplifiers configured in a cascade configuration and configured to sequentially amplify the received signal based on a control signal; and a controller configured to generate a control signal based on the signal strength information that selects which amplifier output is selected from the three or more amplifiers as the system output, wherein the system is part of a receiver in a passive optical network, and as part of operation of the passive optical network, the power level changes over time and wherein the control signal is configured to select as an output a signal that has been amplified but which has not undergone non-linear amplification.

20. The system of claim 19, wherein the system further comprises an optical detector configured to convert an optical signal to an electrical signal.

21. The system of claim 19, wherein the power level detector comprises one or more peak detectors.

22. The system of claim 19, wherein the controller comprises a switch.

* * * * *